United States Patent
Schamberger et al.

(10) Patent No.: US 6,344,757 B1
(45) Date of Patent: Feb. 5, 2002

(54) CIRCUIT CONFIGURATION FOR PROGRAMMING AN ELECTRICALLY PROGRAMMABLE ELEMENT

(75) Inventors: Florian Schamberger, Bad Reichenhall; Helmut Schneider, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/566,067

(22) Filed: May 5, 2000

(30) Foreign Application Priority Data

May 5, 1999 (DE) .................................. 199 20 721

(51) Int. Cl.[7] .......................................... H03K 19/173
(52) U.S. Cl. .................................... 326/38; 326/16
(58) Field of Search ........................ 326/37–41, 16; 327/525

(56) References Cited

U.S. PATENT DOCUMENTS

| | | | | |
|---|---|---|---|---|
| 5,300,840 A | * | 4/1994 | Drouot | 327/525 |
| 5,315,177 A | * | 5/1994 | Zagar et al. | 327/525 |
| 5,477,167 A | * | 12/1995 | Chua | 326/41 |
| 5,986,469 A | * | 11/1999 | Eaton et al. | 326/41 |

FOREIGN PATENT DOCUMENTS

| | | |
|---|---|---|
| DE | 195 43 834 A1 | 7/1996 |
| DE | 196 07 724 A1 | 9/1997 |

* cited by examiner

Primary Examiner—Michael Tokar
Assistant Examiner—Don Phu Le
(74) Attorney, Agent, or Firm—Herbert L. Lerner; Laurence A. Greenberg; Werner H. Stemer

(57) ABSTRACT

A circuit configuration has a switchable element for programming a programmable element whose conductor track resistance can be permanently altered by an electric current or an electric voltage. The programmable element and the switchable element are connected in series and are connected to a first supply potential and a second supply potential, respectively. A monitoring circuit is connected in series with a series circuit formed by the programmable element and the switchable element between the terminals for the first and the second supply potential. The monitoring circuit measures an electrical parameter which is characteristic of a programming operation. Thus, it is possible to monitor the burning operation of the electrically programmable element during the programming operation.

8 Claims, 2 Drawing Sheets

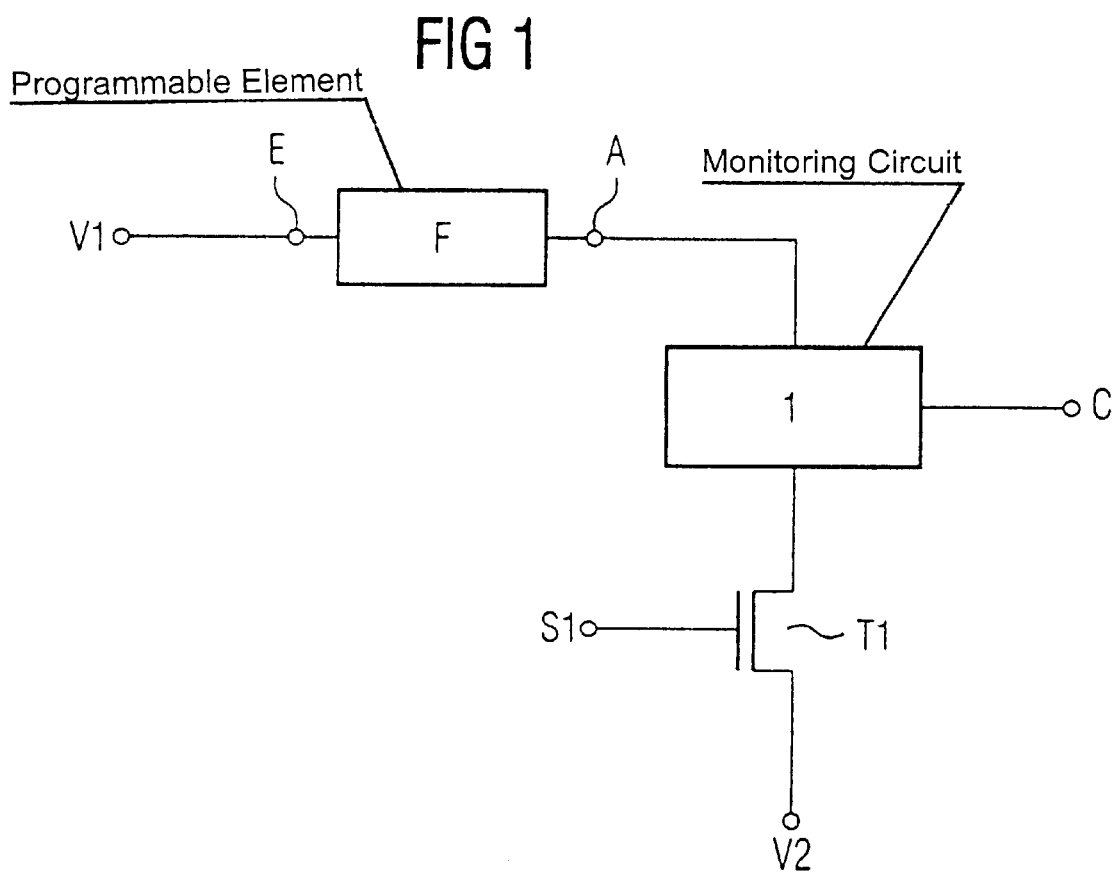

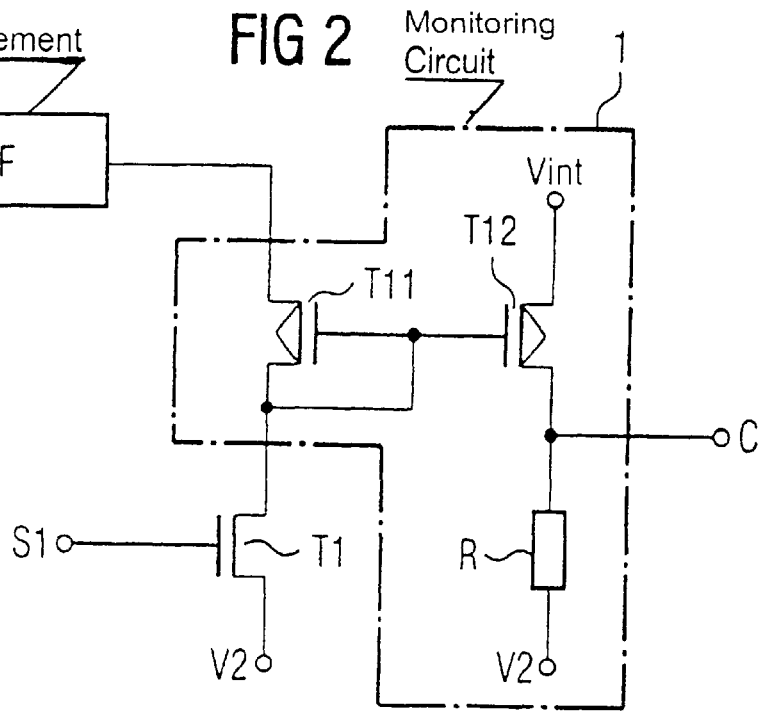
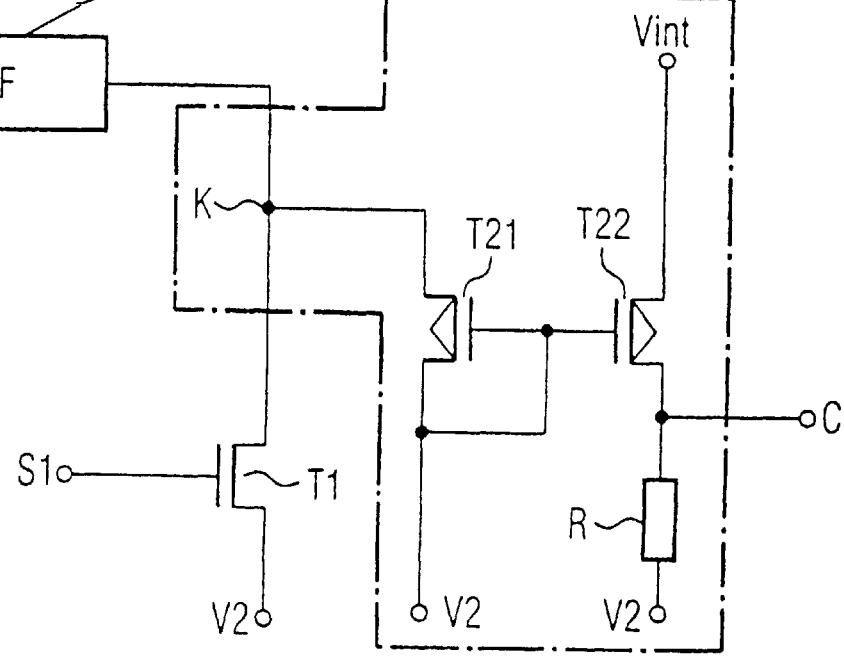

CIRCUIT CONFIGURATION FOR PROGRAMMING AN ELECTRICALLY PROGRAMMABLE ELEMENT

BACKGROUND OF THE INVENTION

FIELD OF THE INVENTION

The invention relates to a circuit configuration for programming an electrically programmable element.

Integrated circuits often have redundancy circuits for repairing defective circuit sections. In particular in the case of integrated memory circuits, these circuits may be, for example, regular word or bit lines with defective memory cells which are replaced by redundant word or bit lines. To that end, the integrated memory is tested for example by a self-test device and a programming of the redundant elements is subsequently performed. A redundancy circuit then has programmable elements, e.g. in the form of electrical fuses, which serve for storing the address of a line to be replaced. The electrical fuses are electrical connection elements whose conductor track resistance can be permanently altered. They can be programmed at the end of the process for fabricating the integrated circuit by applying a so-called burning voltage.

For programming purposes, a burning voltage having a high potential level is usually applied to the circuit externally. The operation for programming electrically programmable elements is then effected for example through the use of a high current, which leads to a lasting alteration of the conductor track resistance, for example by causing a corresponding electrical fuse to melt.

It has been shown that the programming or burning operation which is carried out in order to program programmable elements is not always effected reliably. Moreover, in the course of programming a plurality of programmable elements, the time duration required for the burning operation of one of the programmable elements may differ from the time durations required for the other programmable elements. This may result e.g. from manufacturing tolerances present in the programmable elements. The time durations of the burning operations are usually chosen uniformly for all the elements to be programmed and are preset for example by an internal control of the integrated circuit. Consequently, given a predetermined, uniform time duration of all the programming operations to be performed, the time duration should be chosen relatively generously in order that as far as possible all the programmable elements will be completely programmed. However, the consequence of this is that the test time of an integrated circuit with the subsequent programming of a multiplicity of programmable elements can increase considerably.

If no monitoring or check with regard to whether the programming of the programmable elements has been carried out successfully, is performed at the end of this process, then an unnoticed quality defect of the relevant integrated circuit can result if a defectively programmed element is present.

To date, it has been customary to perform all the necessary programming or burning operations of the elements to be programmed and subsequently to monitor them. Once such test results are available, a decision can be taken as to whether the relevant circuit will be subjected to another burning operation. The consequence of this is that the time duration for the completion of the integrated circuit is prolonged once again. If, on the other hand, a further burning operation is dispensed with, the integrated circuit must be identified as defective, for example. This means that, in the course of the fabrication of a plurality of integrated circuits, the yield of integrated circuits having entirely satisfactory quality decreases.

SUMMARY OF THE INVENTION

It is accordingly an object of the invention to provide a circuit configuration for programming an electrically programmable element which overcomes the above-mentioned disadvantages of the heretofore-known circuit configurations of this general type and which allows to perform a monitoring of the burning operation of the electrically programmable element during the programming operation.

With the foregoing and other objects in view there is provided, in accordance with the invention, a circuit configuration for programming an electrically programmable element, including:

a programmable element having an input, an output, and a conductor track resistance between the input and the output, the conductor track resistance being permanently alterable by one of an electric current and an electric voltage;

a switchable element having a controlled path and a control terminal for providing a control signal for programming the programmable element;

a first contact point for a first supply potential and a second contact point for a second supply potential;

the controlled path of the switchable element and the programmable element being connected in series for forming a series circuit, the series circuit being connected between the first contact point for the first supply potential and the second contact point for the second supply potential;

the programmable element being connected to the first contact point for the first supply potential, the switchable element being connected to the second contact point for the second supply potential; and a monitoring circuit connected in series to the controlled path of the switchable element and the programmable element between the first contact point for the first supply potential and the second contact point for the second supply potential, the monitoring circuit configured for measuring an electrical parameter characteristic for a programming operation.

The circuit configuration has a programmable element, whose conductor track resistance can be permanently altered by an electric current or an electric voltage, and also a switchable element, which has a control terminal with a control signal for programming the programmable element. The programmable element and the switchable element are connected in series between two supply potentials. In this case, the programmable element is connected to a terminal for a first supply potential, and the switchable element is connected to a terminal for a second supply potential. During a burning operation of the electrically programmable element, the first supply potential assumes the value of a burning voltage, for example, and the second supply potential the value of a reference-ground voltage. A monitoring circuit is connected in series with this series circuit between the terminals for the first and the second supply potential, for the purpose of measuring an electrical characteristic quantity or parameter which is characteristic of the programming operation. In this case, a characteristic quantity is used which provides information about whether or when a burning operation has been concluded.

This makes it possible for the integrated circuit to monitor the burning operation of the element to be programmed itself. Using this monitoring information, a control process which automatically controls the programming operation can be integrated in the programming operation. This can be realized for example by a control circuit which is integrated on the chip, evaluates the measurements of the monitoring circuit step by step, and uses this information to monitor or control the burning operation. In this way, it is possible to intervene in a programming operation already during the programming operation. Compared to the preset time duration, the programming operation can be correspondingly lengthened, so that it is terminated, as far as the time is concerned, and a renewed programming operation does not have to be initiated. Likewise, the programming operation can be automatically shortened as soon as it is completely terminated. In both cases, a minimum time duration which is necessary for completely programming a programmable element is ensured.

Furthermore, the circuit configuration according to the invention may advantageously be used in an integrated circuit containing a self-test device with a self-repair function. By virtue of an automatic control of the programming operation, the quality of a self-repair that has been performed is increased in a circuit of this type.

In a preferred embodiment of the invention, the electric current of the series circuit between the terminals for the first and second supply potentials is used as the measured characteristic quantity. As a result of the potential difference, a current flows in the series circuit formed by the programmable element and the switchable element. The value of this current likewise changes on account of the change of the conductor track resistance of the programmable element. In the course of a burning operation, this burning current alters significantly, and abruptly in the case of an electrical fuse. As soon as this alteration has occurred, it can be assumed that the electrical fuse is completely programmed.

A simple embodiment of the monitoring circuit for measuring the burning current provides a current mirror which is connected with its input path in series with the series circuit formed by the programmable element and the switchable element. A terminal for an output signal of the monitoring circuit, which is used for evaluation purposes, is connected to the output path of the current mirror. The use of a current mirror ensures a complete decoupling of the burning current of the series circuit formed by the programmable element and the switchable element and of the measurement current in the output path of the current mirror. Moreover, the profile of the burning current can be reconstructed in a simple manner by virtue of the proportional relationship between the burning current in the input path of the current mirror and the measurement current in the output path of the current mirror.

In a further embodiment, the voltage potential at that terminal of the programmable element which is remote from the first supply potential is used as the measured characteristic quantity. Its value is dependent on the size of the conductor track resistance of the programmable element and of the contact resistance of the switchable element in conjunction with the magnitude of the burning current, and likewise alters in the course of the programming. This embodiment has the advantage over direct measurement of the burning current that it is not necessary to provide a further component in the series circuit formed by the programmable element and the switchable element. On account of the high potential differences between the first and second supply potentials, the component must be dimensioned such that it is relatively large, resulting in an increased space requirement if there are a multiplicity of programmable elements.

This embodiment is realized for example by a monitoring circuit which once again has a current mirror which is connected by a first terminal of the input path to that terminal of the programmable element which is remote from the first supply potential, and by a second terminal of the input path to the terminal for the second supply potential. The terminal for the output signal of the monitoring circuit is connected to the output path of the current mirror. The current which is present, proportionally to the potential difference, in the input path is mirrored into the output path and can be measured using the output signal of the monitoring circuit.

Other features which are considered as characteristic for the invention are set forth in the appended claims.

Although the invention is illustrated and described herein as embodied in a circuit configuration for programming an electrically programmable element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic diagram of a circuit configuration according to the invention for programming an electrically programmable element, the circuit configuration includes a monitoring circuit; and FIGS. 2 and 3 are schematic circuit diagrams illustrating embodiments of the monitoring circuit.

DESCRIPTION OF THE PREFERRED EMBODIMENTS

Referring now to the figures of the drawings in detail and first, particularly, to FIG. 1 thereof, there is shown a circuit configuration having a programmable element F with an input E and an output A, whose conductor track resistance between the input E and the output A can be lastingly altered in this case by an electric current. The circuit configuration furthermore contains a switchable element T1, which has a controlled path and a control terminal S1 with a control signal for programming the programmable element F. The switchable element T1 is embodied as a transistor in this case. The programmable element F and the controlled path of the switchable element T1 are connected in series and are Ad, connected to the supply potentials V1 and V2. During a programming operation, by way of example, the potential V1 assumes the value of a burning voltage and the potential V2 the value of a reference-ground voltage. A programming operation of the programmable element F is initiated via the control input S1 of the switchable element T1. The switchable element T1 is switched on (conducting state) and the burning voltage is applied, whereupon a high current flows through the programmable element F on account of the potential difference between the terminals of the potentials V1 and V2.

Furthermore, the monitoring circuit 1 is connected in series with the series circuit formed by the programmable element F and the switchable element T1. This monitoring circuit measures an electrical characteristic quantity or electrical parameter which is characteristic of the programming operation. The result of the measurement can be picked off at the output C of the monitoring circuit 1.

FIG. 2 shows an embodiment of the monitoring circuit 1 of FIG. 1. The monitoring circuit 1 has a current mirror formed by the transistors T11 and T12. In this case, the controlled path of the transistor T11 forms the input path of the current mirror, and the controlled path of the transistor T12 forms the output path of the current mirror. The input path of the current mirror is connected in series with the series circuit formed by the programmable element F and the switchable element T1, in this embodiment between the programmable element F and the switchable element T1. However, a different location in the series circuit between the potentials V1 and V2 would also be conceivable. The measurement current in the output path of the current mirror brings about a voltage drop across the resistor R. This voltage drop can be tapped off at the output C of the monitoring circuit 1. The transistors T11 and T12 are usually dimensioned identically. In FIG. 2, the transistor T12 is connected to an internal supply potential $V_{int}$.

FIG. 3 illustrates a further embodiment of the monitoring circuit 1. The monitoring circuit likewise has a current mirror formed by the transistors T21 and T22. With its controlled path, the transistor T21 forms the input path of the current mirror, and the controlled path of the transistor T22 forms the output path of the current mirror. A first terminal of the input path is connected to the node K at that terminal A of the programmable element F which is remote from the first supply potential V1. The terminal C for the output signal of the monitoring circuit 1 is connected to the current mirror of the monitoring circuit 1 in the same way as shown in FIG. 2. The difference between the potential at the node K and the potential V2 causes a current in the controlled path of the transistor T21, whose changes can be measured at the terminal C.

We claim:

1. A circuit configuration for programming an electrically programmable element, comprising:

a programmable element having an input, an output, and a conductor track resistance between said input and said output, said conductor track resistance being permanently alterable by one of an electric current and an electric voltage;

a switchable element having a controlled path and a control terminal for providing a control signal for programming said programmable element;

a first contact point for a first supply potential and a second contact point for a second supply potential;

said controlled path of said switchable element and said programmable element being connected in series for forming a series circuit, said series circuit being connected between said first contact point for the first supply potential and said second contact point for the second supply potential;

said programmable element being connected to said first contact point for the first supply potential, said switchable element being connected to said second contact point for the second supply potential; and a monitoring circuit connected in series to said controlled path of said switchable element and said programmable element between said first contact point for the first supply potential and said second contact point for the second supply potential, said monitoring circuit configured for measuring an electrical parameter characteristic for a programming operation, said monitoring circuit having a current mirror with an input path and an output path, said input path is connected to said programmable element, and said monitoring circuit having a output terminal for providing an output signal, said output terminal being connected to said output path of said current mirror.

2. The circuit configuration according to claim 1, wherein said monitoring device is configured for measuring an electrical current between said first contact point and said second contact point as the electrical parameter.

3. The circuit configuration according to claim 1, wherein said programmable element has a terminal remote from said first contact point, said monitoring device is configured for measuring a voltage potential at said terminal remote from said first contact point.

4. The circuit configuration according to claim 2, wherein:
   said input path of said current mirror is connected in series 5. The circuit configuration according to claim 3, wherein:
   said input path of said current mirror has a first terminal connected to said terminal of said programmable element remote from said first contact point, and said input path has a second terminal connected to said second contact point for the second supply potential.

6. The circuit configuration according to claim 1, wherein said the programmable element has an electrical fuse.

7. A circuit configuration for programming an electrically programmable element, comprising:

a programmable element having an input, an output, and a conductor track resistance between said input and said output, said conductor track resistance being permanently alterable by one of an electric current and an electric voltage;

a switchable element having a controlled path and a control terminal for providing a control signal for programming said programmable element;

a first contact point for a first supply potential and a second contact point for a second supply potential;

said controlled path of said switchable element and said programmable element being connected in series for forming a series circuit, said series circuit being connected between said first contact point for the first supply potential and said second contact point for the second supply potential;

said programmable element being connected to said first contact point for the first supply potential, said switchable element being connected to said second contact point for the second supply potential; and a monitoring circuit connected in series to said controlled path of said switchable element and said programmable element between said first contact point for the first supply potential and said second contact point for the second supply potential, said monitoring circuit configured for measuring an electrical parameter characteristic for a programming operation, said monitoring device being configured for measuring an electrical current between said first contact point and said second contact point as the electrical parameter, said monitoring circuit having a current mirror with an input path and an output path, said input path being connected in series with said programmable element and said switchable element, said monitoring circuit having a terminal for an output signal from said monitoring circuit, and said terminal being connected to said output path of said current mirror.

8. A circuit configuration for programming an electrically programmable element, comprising:

a programmable element having an input, an output, and a conductor track resistance between said input and said output, said conductor track resistance being permanently alterable by one of an electric current and an electric voltage;

a switchable element having a controlled path and a control terminal for providing a control signal for programming said programmable element;

a first contact point for a first supply potential and a second contact point for a second supply potential;

said controlled path of said switchable element and said programmable element being connected in series for forming a series circuit, said series circuit being connected between said first contact point for the first supply potential and said second contact point for the second supply potential;

said programmable element being connected to said first contact point for the first supply potential, said switchable element being connected to said second contact point for the second supply potential; and a monitoring circuit connected in series to said controlled path of said switchable element and said programmable element between said first contact point for the first supply potential and said second contact point for the second supply potential, said monitoring circuit configured for measuring an electrical parameter characteristic for a programming operations, said monitoring circuit having a current mirror with an input path and an output path, said input path having a first terminal connected to said terminal of said programmable element remote from said first contact point, said input path having a second terminal connected to said second contact point for the second supply potential, said monitoring circuit having an output terminal for providing an output signal, said output terminal being connected to said output path of said current mirror; and said programmable element having a terminal remote from said first contact point, said monitoring device being configured for measuring a voltage potential at said terminal remote from said first contact point.

* * * * *